(12) United States Patent
Hikmet et al.

(10) Patent No.: US 10,948,140 B2
(45) Date of Patent: Mar. 16, 2021

(54) LED STRIPS WITH CONICAL STRUCTURE FOR COLLIMATED LIGHT EMISSION

(71) Applicant: SIGNIFY HOLDING B.V., Eindhoven (NL)

(72) Inventors: Rifat Ata Mustafa Hikmet, Eindhoven (NL); Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/646,065

(22) PCT Filed: Aug. 31, 2018

(86) PCT No.: PCT/EP2018/073428
§ 371 (c)(1),
(2) Date: Mar. 10, 2020

(87) PCT Pub. No.: WO2019/048345
PCT Pub. Date: Mar. 14, 2019

(65) Prior Publication Data
US 2020/0200337 A1    Jun. 25, 2020

(30) Foreign Application Priority Data

Sep. 11, 2017   (EP) .................................... 17190382

(51) Int. Cl.
*F21S 4/24*     (2016.01)
*F21V 7/04*     (2006.01)
*F21V 31/04*    (2006.01)
*H05K 1/02*     (2006.01)
*H05K 1/18*     (2006.01)
(Continued)

(52) U.S. Cl.
CPC ................ *F21S 4/24* (2016.01); *F21V 7/041* (2013.01); *F21V 31/04* (2013.01); *H05K 1/028* (2013.01); *H05K 1/0274* (2013.01); *H05K 1/189* (2013.01); *F21Y 2103/10* (2016.08); *F21Y 2107/70* (2016.08); *F21Y 2115/10* (2016.08); *H05K 2201/055* (2013.01); *H05K 2201/10106* (2013.01)

(58) Field of Classification Search
CPC ........... F21S 4/24; H05K 1/028; H05K 1/189; H05K 2201/055; H05K 2201/09081; H05K 2201/091; F21Y 2107/70; F21V 7/18
See application file for complete search history.

(56) References Cited

U.S. PATENT DOCUMENTS 9,872,381 B2 *  1/2018  Sepkhanov .......... H05K 1/0277
2011/0267812 A1  11/2011  Van De Ven et al.
(Continued)

FOREIGN PATENT DOCUMENTS

EP    3094161 A1    11/2016
JP    2005340184 A  12/2005
JP    2009289724 A  12/2009

*Primary Examiner* — Evan P Dzierzynski
*Assistant Examiner* — Keith G. Delahoussaye
(74) *Attorney, Agent, or Firm* — Daniel J. Piotrowski

(57) ABSTRACT

The present invention relates to an LED strip, comprising a plurality of LEDs mounted on a LED mounting surface of a flat, flexible substrate, wherein said LED mounting surface is light reflective, wherein said flexible substrate is shaped to form at least one conical structure, and wherein a subset of said plurality of LEDs is located inside at least one of the at least one conical structure.

14 Claims, 5 Drawing Sheets

(51) Int. Cl.
    *F21Y 103/10*     (2016.01)
    *F21Y 115/10*     (2016.01)
    *F21Y 107/70*     (2016.01)

(56) References Cited

U.S. PATENT DOCUMENTS

| | | | |
|---|---|---|---|
| 2014/0321126 A1* | 10/2014 | Narag, II | F21K 9/00 362/306 |
| 2014/0369038 A1 | 12/2014 | Tischler et al. | |
| 2015/0036351 A1* | 2/2015 | Yang | F21K 9/00 362/297 |
| 2015/0354797 A1 | 12/2015 | Luo et al. | |

\* cited by examiner

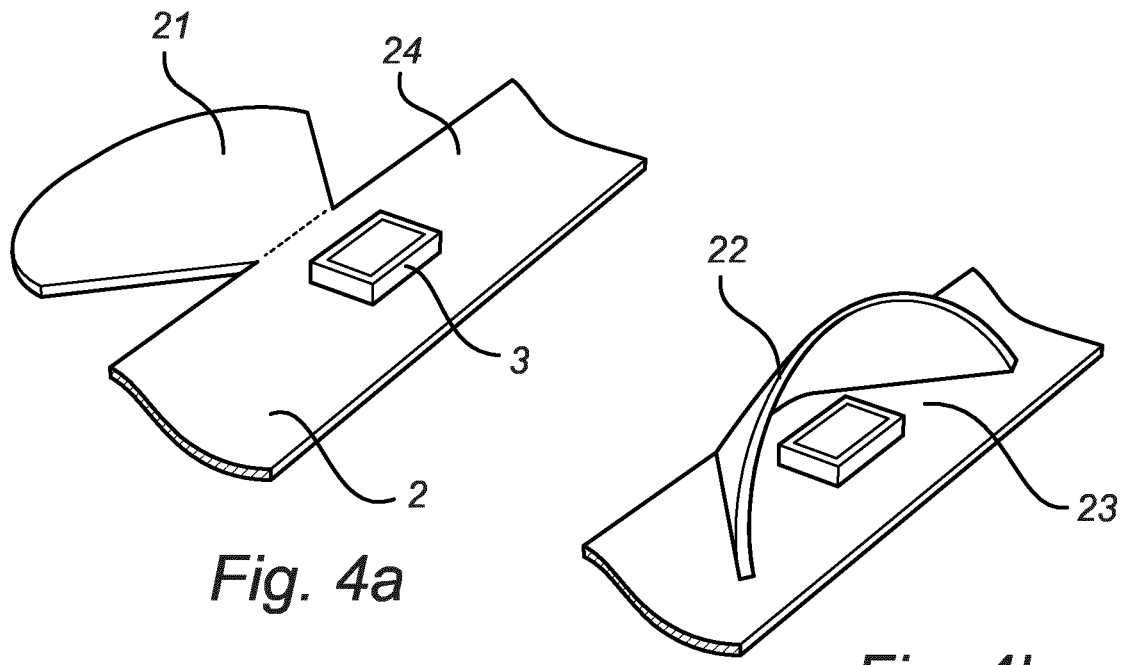
Fig. 4a
Fig. 4b
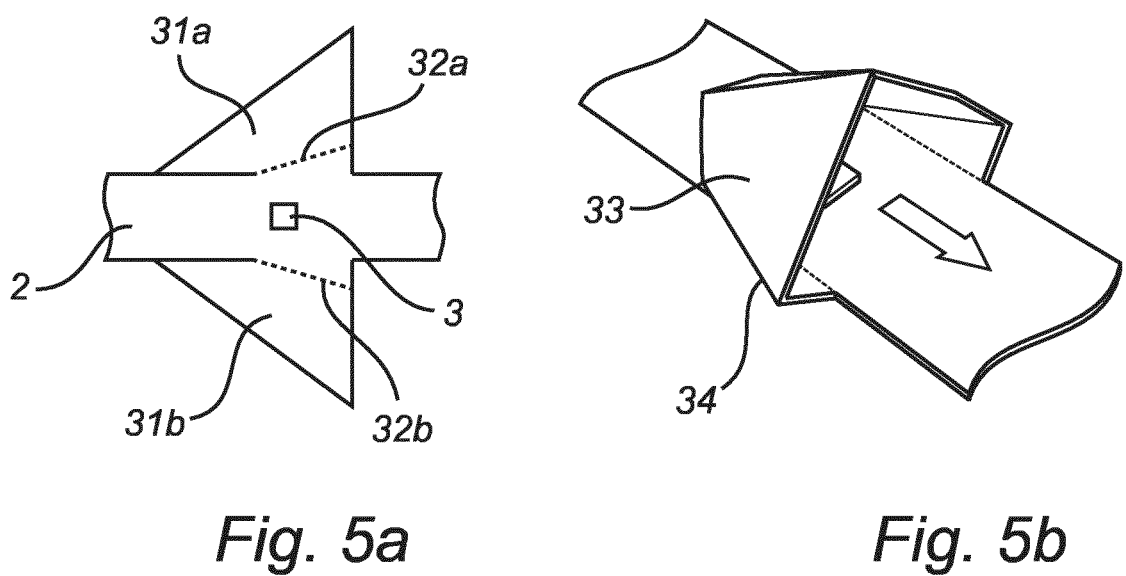
Fig. 5a
Fig. 5b

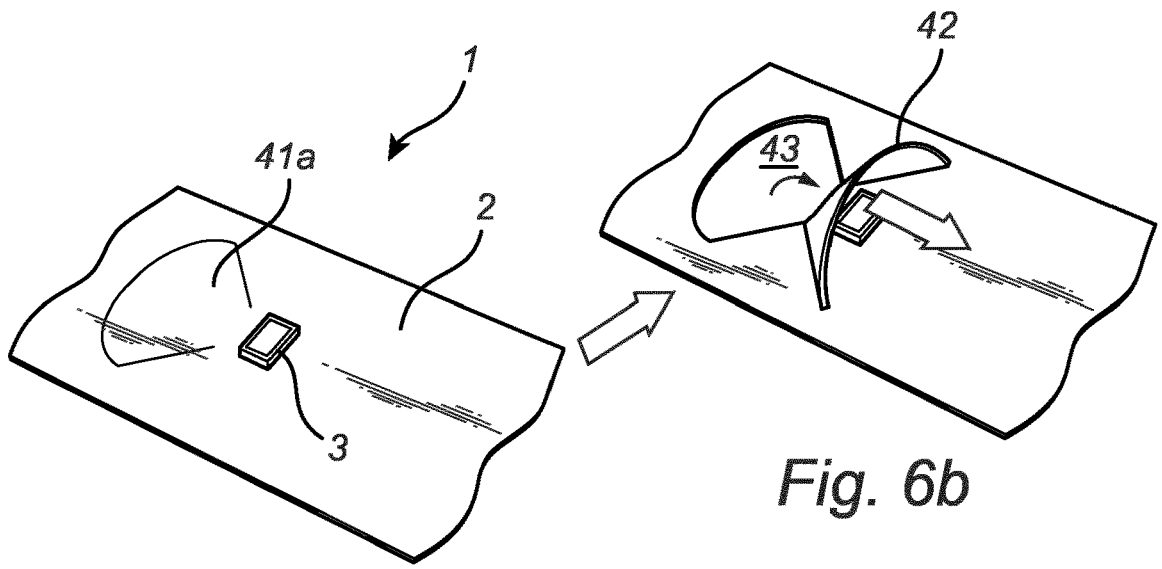
Fig. 6a
Fig. 6b
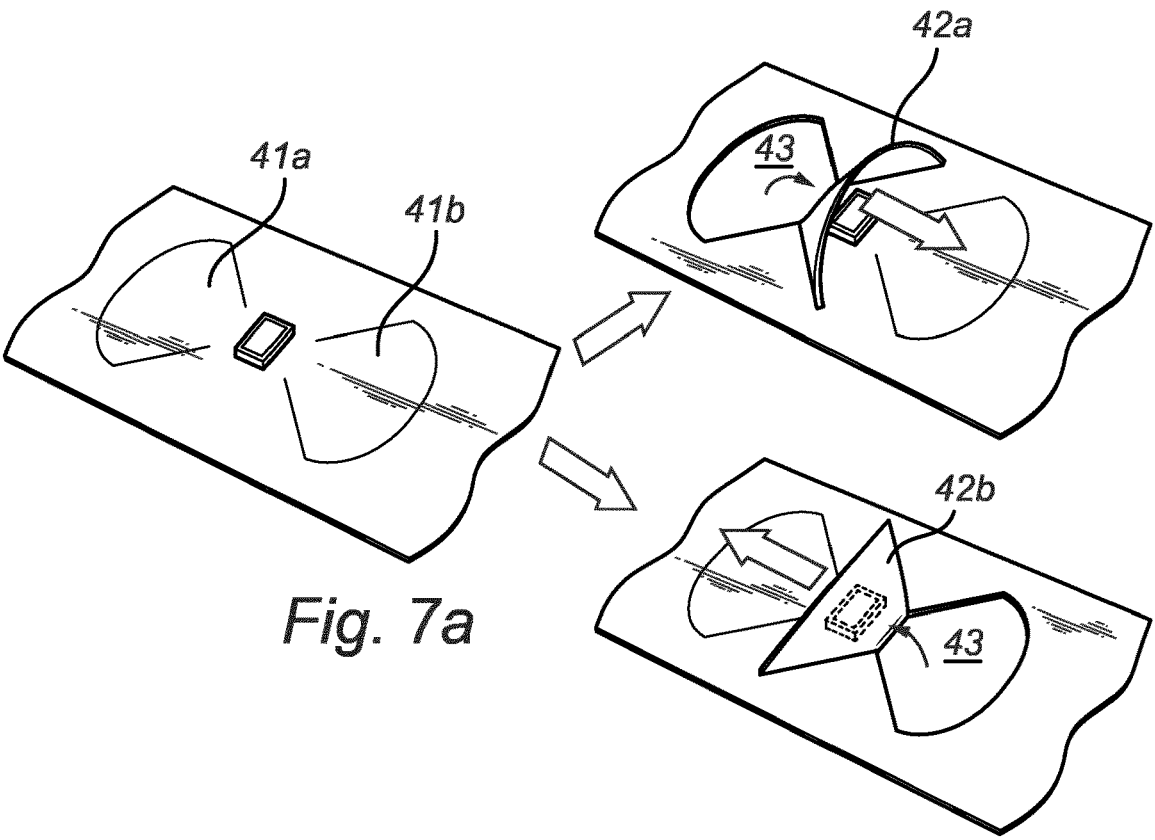
Fig. 7a
Fig. 7b

LED STRIPS WITH CONICAL STRUCTURE FOR COLLIMATED LIGHT EMISSION

CROSS-REFERENCE TO PRIOR APPLICATIONS

This application is the U.S. National Phase application under 35 U.S.C. § 371 of International Application No. PCT/EP2018/073428, filed on Aug. 31, 2018, which claims the benefit of European Patent Application No. 17190382.6, filed on Sep. 11, 2017. These applications are hereby incorporated by reference herein.

FIELD OF THE INVENTION

The present invention relates to LED strips, comprising a plurality of LEDs mounted on a LED mounting surface of a flat, flexible substrate, such as a flexible PCB.

BACKGROUND OF THE INVENTION

LED strips including a plurality of LEDs arranged on a ribbon of a flat, flexible PCB which provides electrical connection of the LEDs, are increasingly used in various lighting applications such as in retail and at home. The LED strips may be integrated with control circuitry to have increased functionality such as connectivity etc.

In a conventional LED strip, to facilitate manufacturing, all LEDs are placed on the same side of the flexible PCB. Therefore the light emission is in the same direction. It is of course possible to mount LED on both sides of the PCT ribbon, but that increases manufacturing cost. It is desirable to provide a more cost efficient way to allow light emission from a LED strip in different directions. Also, in some applications it is desirable to provide LED strips with collimated light emission.

In US 2011/0267812 an LED lighting device is disclosed in which—amongst others—a lighting device is shown comprising a frusto-conical carrier which is provided with an LED strip that is spirally connected to said carrier.

SUMMARY OF THE INVENTION

It is an object of the present invention to provide a LED strip which overcomes at least one of the problems listed above.

According to a first aspect of the present invention, this and other objects are achieved by a LED strip comprising a plurality of LEDs mounted on a LED mounting surface of a flat, flexible substrate, wherein the LED mounting surface is light reflective, wherein the flexible substrate is shaped to form at least one conical structure, and wherein a subset of the plurality of LEDs is located inside at least one of the at least one conical structure.

It is noted that only a "subset" of the LEDs on the LED strip are located in the conical structure. In other words, the LED strip continues on at least one, and typically on both, side of the conical structure. The subset may consist of one single LED or a group of LEDs.

According to the invention, light from the LED(s) which is/are located in the conical structure will be collimated by the reflective inner surface of the conical structure. Light emitted from the LED strip may thus be easier directed and controlled. Additional components are not required, as the conical structure is formed by the LED strip itself.

The strip may include several conical structures, directed in the same direction or in different directions. One or more LEDs may be contained in each conical structure. Alternatively, at least one of the conical structures may not contain any LED(s).

According to one embodiment, the conical structure is formed by twisting an LED strip and bending the strip back over itself. The LED strip will thus include a first LED strip portion and a second LED strip portion, which are joined by a curved LED strip portion forming the conical structure. The first and second LED strip portions will intersect each other adjacent to the curved LED strip portion.

The angle formed between the two straight strip portions will define the opening of the conical structure. A smaller angle will define a broader opening, while a larger angle will define a more narrow opening. In one example, the angle is 90 degrees.

When a plurality of conical structures are formed in this way, the LED strip may form one of a rectangular path, a polygon path and a meander path.

According to another embodiment, the flexible substrate comprises a flap portion which is bendable over the subset of LEDs to form the conical structure. In this embodiment, the entire LED strip does not need to be bent or curved out of its plane. Instead, a small portion of the substrate will be bent out of the plane of the LED strip to form the conical structure. Each conical structure may be formed by one flap portion, or by several flap portions.

The flexible substrate may comprise more than one flap which are bendable over different subsets of LEDs to form several conical structure with openings in different directions.

The flexible substrate may comprise two flap portions, located on opposite sides of a subset of LEDs, such that the two flap portions are bendable in opposite directions over the subset of LEDs to form the conical structure. In other words, if the first flap is bent of the LED subset, the conical structure will have an opening in a first direction, while if the second flap is bent of the LED subset, the conical structure will have an opening in a second direction.

The flap(s) can be formed within the outer contour of the flexible substrate, i.e. be surrounded by the flexible substrate, such that when a flap is bent over a subset of LEDs, an opening is formed in the flexible substrate. In this case, the presence of flap(s) does not affect the outer contour of the LED strip, and each flap is protected by the surrounding substrate until its use.

In some embodiments, a reflectivity of said mounting surface is at least 80%, more preferably at least 85%, and most preferably at least 88%. A high reflectivity improves the collimation provided by the conical structure.

Further, at least some of the conical structures may be filled with a transparent filling material. Such a filling material can provide structural stability to the conical structure, and may be e.g. a transparent polymer. The filling material may also provide desired optical properties. For example, the filling material may include scattering particles or phosphor material.

The invention also relates to a luminaire comprising a LED strip according to the first aspect of the invention.

BRIEF DESCRIPTION OF THE DRAWINGS

This and other aspects of the present invention will now be described in more detail, with reference to the appended drawings showing currently preferred embodiment(s) of the invention.

FIGS. 4a-8b illustrate another set of embodiments of the present invention.

DETAILED DESCRIPTION

Currently preferred embodiments of the present invention will now be described in more detail, with reference to the accompanying drawings. The invention may, however, be embodied in many different forms and should not be construed as limited to the embodiments set forth herein; rather, these embodiments are provided for thoroughness and completeness, and fully convey the scope of the invention to the skilled person.

Figure 1:
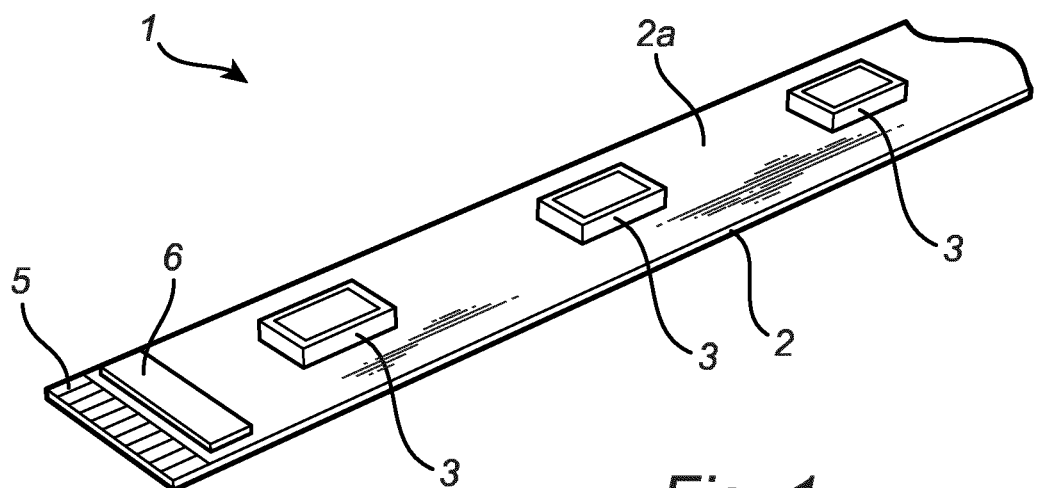
FIG. 1 shows a perspective and schematic view of a LED strip.

The LED strip 1 in FIG. 1 comprises a flexible substrate 2 having a LED mounting surface 2a on which a plurality of LEDs 3 are mounted. The mounting surface 2a is here specularly reflecting, preferably with a reflectivity of more than 80%, in some examples more than 85%, and in some examples more than 88%.

The LEDs are electrically connected, preferably by electrically conducting paths on or in the substrate 2. In one example, the flexible substrate is a flexible printed circuit board (PCB), thereby providing a simple and efficient way to electrically connect the LEDs 3. The LED strip is here provided with a connection terminal 5 in one end, allowing electrical connection of the LED strip to a power supply (not shown). The LEDs 3 may be addressable, i.e. selectively powered, and for this purpose the LED strip may include a controller 6. In this case, the connection terminal 5 allows for connection not only of power, but also of a control signal. The controller 6 could also be used for controlling the color or color temperature of LEDs in a cone.

Figure 2:
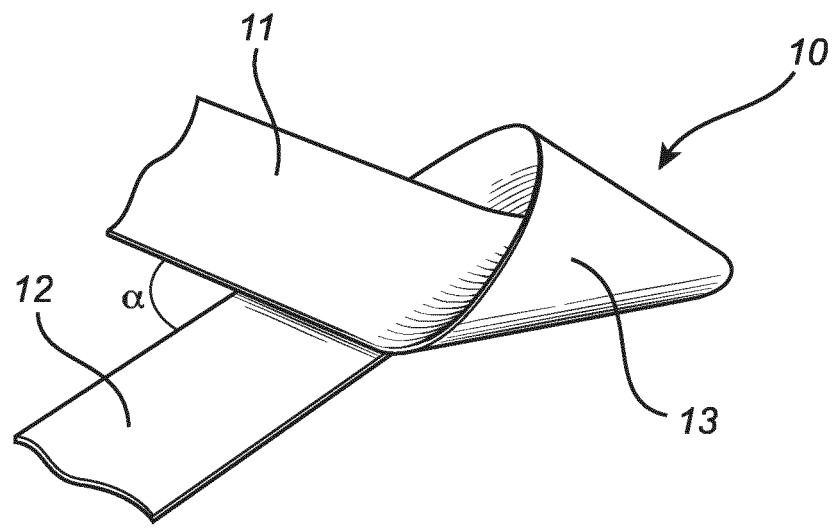
FIG. 2 is a partial view of an LED strip according to an embodiment of the invention.

FIG. 2 shows an embodiment of the invention where the LED strip 1 has been bent around itself to form a conical structure 10. The illustrated LED strip 1 has a first straight portion 11 and a second straight portion 12, and a conically curved portion 13 which joins the first and second portions. The first and second portions intersect at an angle alpha.

Figure 3A:
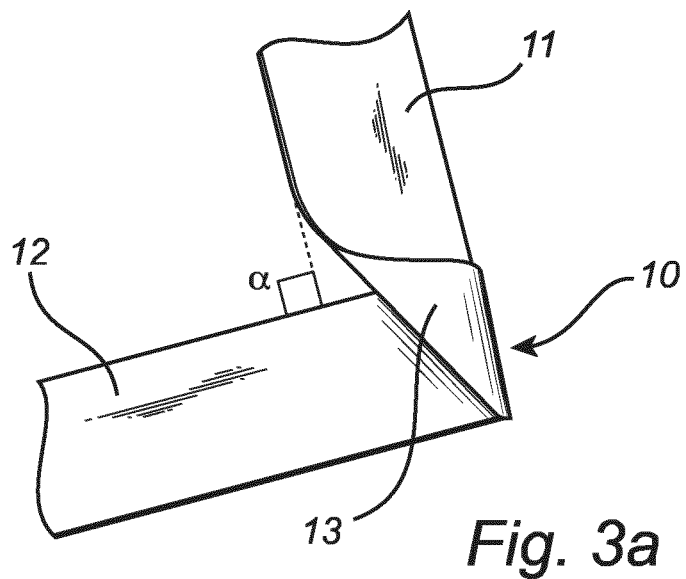
FIG. 3a is a partial view of an LED strip according to an embodiment of the invention.
Figure 3B:
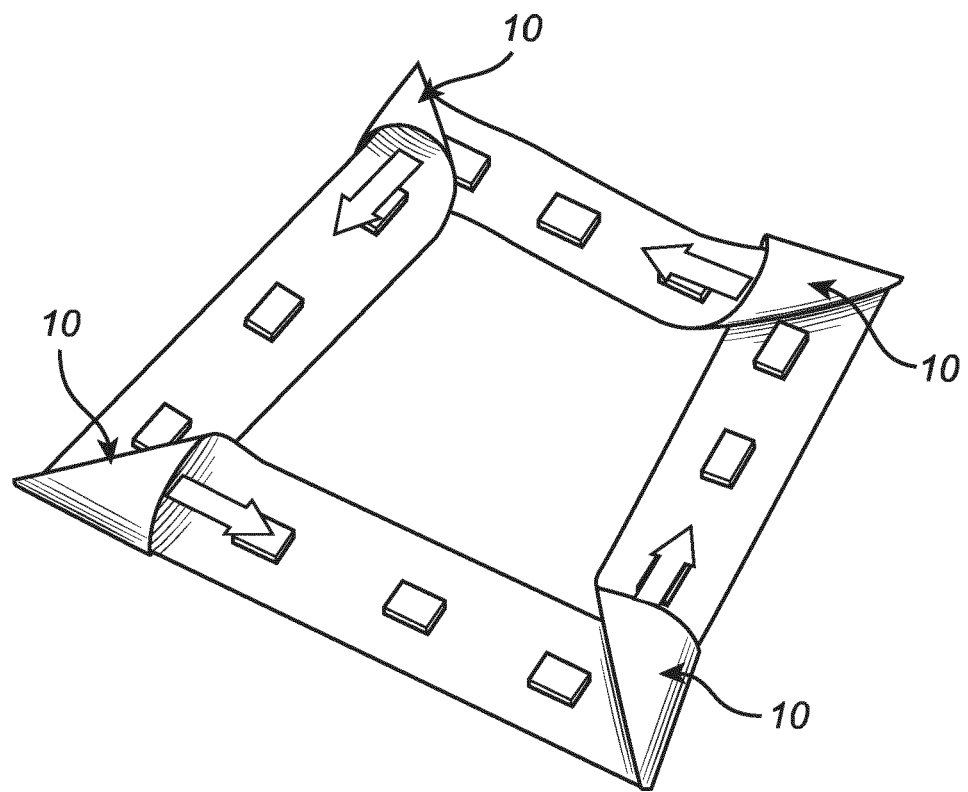
FIG. 3b shows a perspective and schematic view of an LED strip.

In FIG. 3a, the LED strip 1 is bent in a similar way as in FIG. 2, but here the angle alpha is substantially 90 degrees. In FIG. 3b, the LED strip 1 has been bent to form several conical structures 10, so that the LED strip forms a rectangular form. The skilled person will realize that if the conical structures 10 in FIG. 3b were formed in alternating directions, the LED strip would form a meander form. It is also noted that several conical structures may also be formed with the angle alpha smaller than 90 degrees (as illustrated in FIG. 2). In this case, a LED strip with three conical structures may form a triangular form, or again a meander form.

FIGS. 4-8 illustrate another set of embodiments, where one or several flaps formed in the flexible substrate 2 is used to form the conical structures 10. The flap(s) is/are bent over a subset of LEDs, to form a "truncated" conical structure, formed by a generally flat portion of the LED strip and a dome formed by the flap(s). The illustrated examples will be described briefly in the following.

In the embodiment illustrated in FIG. 4a-4b, a flap is formed as a protrusion 21 extending from one longitudinal side 24 of the substrate 2. The protrusion 21 here has the shape of a circle sector. As shown in FIG. 4b, the sector shaped protrusion 21 can be folded over one of the LEDs 3 to form a partially conical dome 22 over a flat portion 23 of the LED strip 2 where the LED 3 is mounted. As the protrusion 21 is here folded across the longitudinal extension of the LED strip 1, the opening of the dome, and thus the direction of collimated light, will be generally normal to the longitudinal extension of the LED strip 1.

In the embodiment in FIGS. 5a-5b, two flaps are formed as two protrusions 31a, 31b extending on opposite sides of the substrate 2. The protrusions 31a, 31b are here illustrated as only partially connected to the main ribbon of the substrate along two folding lines 32a, 32b. A LED 3 is located in an area generally between these folding lines. As shown in FIG. 5b, the protrusions 31a, 31b can be folded towards the center of the LED strip 1, so as to make contact with each other along an arc 33 extending from the mounting surface 2a to an opening of a dome 34. The opening of the dome, and thus the direction of collimated light, is here along the longitudinal direction of the LED strip 1.

In the embodiment in FIGS. 6a-6b, a flap 41 with similar shape as the protrusion 21 in FIG. 4a is formed, e.g. cut or punched, within the outer contour of the substrate 2. As shown in FIG. 6b, the flap 41 can be bent out of the plane of the LED strip 1, and folded over a LED 3 to form a dome 42 similar to the dome in FIG. 4b. The flap 41 can here be formed with any orientation, so that the opening of the dome, and thus the direction of collimated light, can be in any direction. A hole 43 is formed in the substrate 2 where the flap 41 used to be.

As an extension to the embodiment in FIG. 6a-6b, two flaps 41a, 41b can be cut or punched in the substrate 2 on different sides of a LED 3. This is shown in FIG. 7a-7b, where the flaps 41a, 41b are one opposite sides of the LED 3. With this design, either one of the flaps 41a, 41b can be bent over the LED 3. Depending on which flap 41a, 41b is chosen, the opening of the dome 42a, 42b, and thus the direction of collimated light will be different (here opposite). Again, a hole 43 will be formed where the selected flap used to be.

Figure 8A:
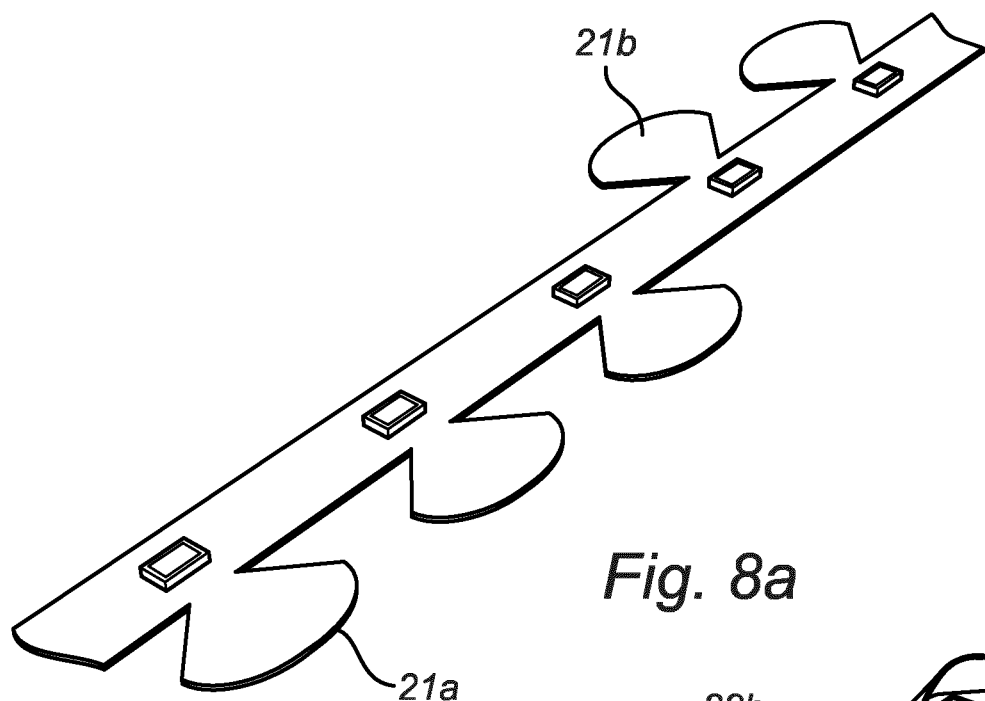
Figure 8B:
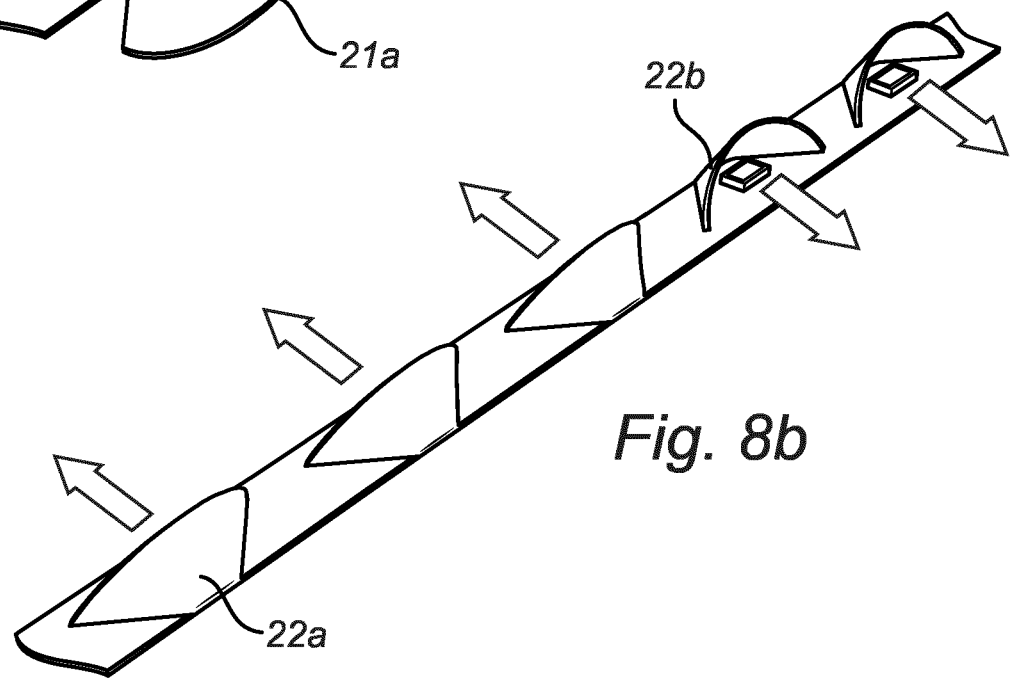

FIGS. 8a-8b show an extension of the embodiment in FIG. 4a-4b, where protrusions 21a, 21b similar to that in FIG. 4a are formed on both sides of the LED strip 1, i.e. some protrusions 21a extend from one longitudinal side, while other protrusions 21b extend from the opposite side. When the protrusions 21a, 21b are folded over the respective LEDs 3 (FIG. 8b) the domes 22a formed by the protrusions 21a fill face in one direction, while domes 22b formed by the protrusions 21b will face an opposite direction. The LED strip 1 in FIG. 8a-8b will thus be able to emit collimated light in two opposite directions.

By using two (or more) sets of LEDs which can be addressed separately and conical structures positioned in different directions, as disclosed in FIGS. 3 and 8a-8b, beam shaping and various decorative lighting patterns can be obtained.

In all embodiments discussed above, the conical structures 10 (formed by bending the strip as in FIGS. 2-3, or by bending portions of the substrate 2 to form domes as in FIGS. 4-8) may be fixed in some manner, e.g. glued, stapled, stitched, etc., to maintain their shape. Alternatively, or additionally, the entire LED strip 1, including the conical structures, may be encapsulated in a polymer, such as silicone. Further, each conical structure may be filled with a transparent filling material. Such filling material may also contribute to maintaining the shape of the conical structure, and may be used instead of or in combination with other means of fixation. Such a filling material may further provide a desired optical effect such as coloring, and may for that purpose include e.g. scattering particles or a phosphor material. Further, each conical structure may be shaped such that it only has one light exit, i.e. no light leakage at other portions of the conical structure. Further, the LEDs may be phosphor converted LEDs or direct emitting LEDs. These LEDs may be used to create white light. RGB LEDs may also be used to make white light.

Furthermore, the present LED strip 1 may have a length of at least 0.5 meter or at least 1 meter or at least 1.5 meter, such as 2 or 5 meters. The width of the LED strip 1 may be in the range of 0.1 cm to 5 cm or 0.2 cm to 3 cm or 0.3 cm to 2 cm. The length-to-width ratio may be at least 10 or at least 15 or at least 20, such as 50 or 100. The LED strip 1 may comprise three or four conical structures as described above (FIG. 3b). In other embodiments, the LED strip 1 may comprise at least five conical structures or at least eight conical structures or at least ten conical structures. An exemplary LED strip 1 may have a length of 2 meters, a width of 1 cm, and ten conical structures.

Suggested lighting devices can be used in various light emitting devices, such as lamps, retrofit light bulbs, light engines and luminaires.

The person skilled in the art realizes that the present invention by no means is limited to the preferred embodiments described above. On the contrary, many modifications and variations are possible within the scope of the appended claims. For example, it is clear that more than one LED 3 may be located within a conical structure.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. An LED strip, comprising a plurality of LEDs mounted on a LED mounting surface of a flat, flexible substrate, wherein said LED mounting surface is light reflective, wherein said flexible substrate is shaped to form at least one conical structure, and a subset of said plurality of LEDs (3) is located inside at least one of the at least one conical structure,
wherein said conical structure includes a first LED strip portion and a second LED strip portion, said first and second LED strip portions being joined by a conically curved LED strip portion, such that said first and second LED strip portions intersect each other adjacent to the curved LED strip portion.

2. The LED strip according to claim 1, comprising a plurality of conical structures.

3. The LED strip according to claim 1, wherein the first and second LED strip portions intersect each other at an angle of substantially 90 degrees.

4. The LED strip according to claim 1, including a plurality of conical structures, such that said LED strip follows one of a rectangular path, a polygon path and a meander path.

5. An LED strip (1), comprising a plurality of LEDs mounted on a LED mounting surface of a flat, flexible substrate, wherein said LED mounting surface is light reflective, wherein said flexible substrate is shaped to form at least one conical structure, and a subset of said plurality of LEDs is located inside at least one of the at least one conical structure,
wherein said flexible substrate comprises at least one flap portion which is bendable over said subset of LEDs to form said conical structure.

6. The LED strip according to claim 5, wherein the conical structure includes a generally flat portion of said substrate, and a dome formed by the at least one flap.

7. The LED strip according to claim 5, wherein said flap is formed within an outer contour of said flexible substrate and is surrounded by said flexible substrate, such that when said flap is bent over said one of said LEDs, a hole is formed in said flexible substrate.

8. The LED strip according to claim 5, wherein said flexible substrate comprises a first flap which is bendable over said subset of LEDs to form said conical structure with an opening in a first direction, and a second flap which is bendable over said subset of LEDs to form said conical structure with an opening in a second direction.

9. The LED strip according to claim 8, wherein said first flap and said second flap are both formed within an outer contour of said flexible substrate and are surrounded by said flexible substrate, such that when one of said first and second flaps is bent over said subset of LEDs, a hole is formed in said flexible substrate.

10. The LED strip according to claim 5, wherein said flexible substrate comprises at least two flap portions, located on opposite sides of said subset of LEDs, such that said two flap portions are bendable in opposite directions over said subset of LEDs to form said conical structure.

11. The LED strip according to claim 1, wherein a reflectivity of said mounting surface is at least 80%.

12. The LED strip according to claim 1, wherein each conical structure is filled with a transparent filling material.

13. The LED strip according to claim 12, wherein said filling material includes a scattering particles or a phosphor material.

14. A luminaire comprising the LED strip according to claim 1.

* * * * *